(12) United States Patent
Watanabe et al.

(10) Patent No.: US 6,869,819 B2
(45) Date of Patent: Mar. 22, 2005

(54) RECOGNITION METHOD OF A MARK PROVIDED ON A SEMICONDUCTOR DEVICE

(75) Inventors: Mitsuhisa Watanabe, Kawasaki (JP); Yoshikazu Kumagaya, Kawasaki (JP); Akira Takashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 275 days.

(21) Appl. No.: 10/321,629

(22) Filed: Dec. 18, 2002

(65) Prior Publication Data

US 2003/0224540 A1 Dec. 4, 2003

(30) Foreign Application Priority Data

May 28, 2002 (JP) ........................................ 2002-153519

(51) Int. Cl.⁷ .............................................. H01L 21/00
(52) U.S. Cl. ........................................ 438/69; 257/620
(58) Field of Search ............................ 438/68, 69, 110, 438/114; 257/620

(56) References Cited

U.S. PATENT DOCUMENTS 5,430,325 A * 7/1995 Sawada et al. ............. 257/618
6,297,131 B1 * 10/2001 Yamada et al. ............. 438/464

FOREIGN PATENT DOCUMENTS

| JP | 3-23646 | 1/1991 |
| JP | 6-244245 | 9/1994 |

* cited by examiner

*Primary Examiner*—David Nelms
*Assistant Examiner*—Quoc Hoang
(74) *Attorney, Agent, or Firm*—Westerman, Hattori, Daniels & Adrian, LLP

(57) ABSTRACT

A high-contrast image recognition can be performed by recognizing an image of a recognition mark from a back surface of a wafer by a visible-light camera by irradiating a visible light from a circuit pattern surface of a silicon substrate. A thickness of the silicon substrate is set to 5 μm to 50 μm. A white or visible light having a wavelength equal to or less than 800 nm is irradiated onto the circuit-pattern forming surface of the substrate. A visible light that has transmitted through the silicon substrate is received by a visible-light camera on a side of a back surface of the silicon substrate. An image of a recognition mark formed on the circuit-pattern forming surface of the silicon substrate is recognized by the visible-light camera.

10 Claims, 9 Drawing Sheets

RECOGNITION METHOD OF A MARK PROVIDED ON A SEMICONDUCTOR DEVICE

BACKGROUND OF THE INVENTION

1. Field of the Invention

The present invention relates to a manufacturing method of semiconductor devices and, more particularly, to a recognition method of a mark provided on a semiconductor wafer or chip and a manufacturing method and a mounting method of a semiconductor device using such a mark recognition method.

2. Description of the Related Art

Generally in a manufacturing process of semiconductor devices, it is necessary to perform position recognition of a semiconductor wafer or a semiconductor chip. Generally, a method of carrying out the image recognition of a recognition mark provided on a circuit pattern side of a semiconductor wafer or a semiconductor device is used for position recognition. That is, as shown in FIG. 1, a white light etc. is irradiated at the recognition mark (not shown) that has been formed simultaneously with a circuit pattern 2 of a semiconductor wafer 1 so as to monitor the reflection light by a visible-light camera 3 from the side of the circuit pattern surface and recognize the position of the recognition mark.

The FIG. 2 is an illustration showing a manufacturing process of a regular semiconductor device. In the manufacturing process shown in FIG. 2, first, a protective tape 4 is applied onto a circuit pattern surface 2 of a wafer 1, and a back surface 1a of the wafer 1 is grinded so as reduce a thickness of the wafer 1. For example, the thickness of the wafer before grinding is about 700 μm, and the grinding is carried out until the thickness becomes about 15 μm. A dicing tape 5 is applied onto the back surface 1a of the thinned wafer 1, and, subsequently, the protective tape 4 is removed. Thereby, the circuit pattern 2 and a recognition mark are exposed on to the surface, and the image recognition by the visible-light camera 3 becomes possible from the side of the circuit pattern.

Additionally, Japanese Laid-Open Patent Applications No. 6-244245 and No. 3-23646 disclose image recognition methods using an infrared light, which transmits through single-crystal silicon. According to this method, a light transmitted through the single-crystal silicon is limited to an infrared light so as to recognize a recognition mark existing on a circuit pattern surface by an infrared camera on the side of the back surface of a semiconductor chip. It is proposed to use such a method in face-down mounting such as flip-chip mounting or the like.

When the image recognition from the side of the circuit pattern surface is taken into consideration, it is always necessary to perform the tape replacing process to apply a dicing tape 5 and remove the protective tape 4 after reducing the thickness of the wafer 1 after grinding the back surface of the wafer 1. The tape replacing process needs a long production tact time, which causes an increase in cost.

Additionally, since a mechanical strength of the thin wafer falls remarkably, a wafer crack may occur in the tape replacing process. Furthermore, in the recognition on the side of the circuit pattern surface, there is a high possibility of occurrence of a recognition error due to a halation or an external noise.

On the other hand, when the recognition is made on the side of the back surface of the wafer by using transmission of an infrared light, it is very difficult to visually represent a difference in the characteristic since the most part of the infrared light is transmitted through even if the recognition mark and parts surrounding the recognition mark have different transmission characteristics with respect to an infrared since the thickness of the recognition mark and the surrounding parts (circuit patterns) are very thin. Therefore, there is a high-possibility that the contrast of the recognition mark and the surrounding parts become low, which results in a recognition error and is not practical. Additionally, a general-purpose visible-light source, a general-purpose camera, etc. cannot be used as an image recognition unit, but an expensive infrared light-source and an expensive infrared camera are needed.

SUMMARY OF THE INVENTION

It is a general object of the present invention to provide an improved and useful mark recognition method in which the above-mentioned problems are eliminated.

A more specific object of the present invention is to provide a mark recognition method and a manufacturing method and a mounting method, in which a high-contrast image recognition can be performed by recognizing an image of a recognition mark from a back surface of a wafer by a visible-light camera by irradiating a visible light from a circuit pattern surface of the semiconductor wafer.

In order to achieve the above-mentioned objects, there is provided according to one aspect of the present invention a mark recognition method of image recognition of a recognition mark formed on a circuit-pattern forming surface of a silicon substrate, comprising: setting a thickness of the silicon substrate to 5 μm to 50 μm; irradiating a white or visible light having a wavelength equal to or less than 800 nm onto the circuit-pattern forming surface of the substrate; receiving a visible light that has transmitted through the silicon substrate by a visible-light camera on a side of a back surface of the silicon substrate; and recognizing an image of a recognition mark formed on the circuit-pattern forming surface of the silicon substrate.

According to the present invention, since the thickness of the silicon substrate is set to a thickness by which a visible-light is transmitted through the silicon substrate, the image of the recognition mark formed on the circuit-pattern forming surface of the silicon substrate can be recognized from the side of the back surface of the silicon substrate by using the visible light transmitted through the silicon substrate. Therefore, the image recognition of the recognition mark can be performed as it is after the back-surface grinding of the silicone substrate, and the process of exposing the circuit-pattern surface by separating the protective tape stuck on the circuit pattern forming surface can be omitted. Moreover, since a visible light is used as the light which transmits though the silicon substrate, there is no need to use an expensive infrared emitting source and an expensive infrared camera, and, thus, a low-cost image recognition apparatus can be used.

In the mark recognition method according to the present invention, the recognition mark may be a part where a protective film for protecting the circuit pattern of the silicon substrate is partially removed. Accordingly, the recognition mark can be formed by using the protective film, and there is no need to form a separate recognition mark.

Additionally, the visible light may be a red light and the protective film is made of polyimide resin. Since the polyimide resin used for the protective film is generally absorbs a red light, the image recognition can be performed by using a red light.

Further, in the mark recognition method according to the present invention, a contrast of the recognition mark in the recognized image may be increased by increasing a ratio of a thickness of the protective film to a thickness of the silicon substrate. Accordingly, the contrast in the image of the recognition mark can be increased so as to reduce a possibility of erroneous recognition.

Additionally, there is provided according to another aspect of the present invention a manufacturing method of a semiconductor device using a silicon substrate on which a plurality of semiconductor devices are formed simultaneously, comprising the steps of: grinding a back surface of the silicon substrate so as to reduce a thickness to 5 μm to 50 μm; irradiating a white or visible light having a wavelength equal to or less than 800 nm onto a circuit-pattern forming surface of the silicon substrate; receiving the visible light after transmitting through the silicon substrate on a side of the back surface of the silicon substrate; recognizing an image of a recognition mark formed along dicing lines formed on the circuit-pattern forming surface of the silicon substrate; and individualizing the semiconductor devices by dicing from the side of the back surface of the silicon substrate based on a result of the image recognition.

According to the above-mentioned invention, the image recognition of the recognition mark, which corresponds to a dicing line, can be performed from the side of the back surface after the back surface grinding of the silicone substrate. Therefore, the process to expose the circuit-pattern forming surface is simplified, and a reduction in a production tact and a reduction in a manufacturing cost can be achieved.

The manufacturing method according to the present invention may further comprise the steps of: forming a protective film protecting the circuit pattern formed on the silicon substrate; and removing a part of the protective film along the dicing lines so that the removed part is used as the recognition mark. Accordingly, the recognition mark indicating the dicing line can be formed by using the protective film, and, thus, there is no need to form a separate recognition mark for recognizing the dicing line.

Additionally, the manufacturing method according to the present invention may further comprise the steps of: applying a protective film onto the circuit pattern forming surface of the silicon substrate before grinding the silicon substrate; irradiating a visible light onto the circuit-pattern forming surface through the protective tape while the protective film is attached to the silicon substrate after grinding the silicon substrate; recognizing an image of the recognition mark along the dicing lines from the side of the back surface of the silicon substrate; and dicing the silicon substrate by using the protective film applied on the silicon substrate as a dicing tape. Accordingly, since the dicing process can be performed by recognizing the image of the dicing line without separating the protective tape after the back-surface grinding of the silicone substrate, there is no need to perform a tape switching process, which achieves a reduction in a production tact and a reduction in a manufacturing cost.

Further, the manufacturing method according to the present invention may further comprise the step of recognizing a lot number and an identification number provided on the silicon substrate by using the visible light after transmitting through the silicon substrate on the side of the back surface of the silicon substrate. Accordingly, the lot number and identification number of the silicone substrate can be recognized using an image recognition apparatus which carries out the image recognition of the recognition mark of the silicone substrate.

Additionally, there is provided according to another aspect of the present invention a mounting method of a semiconductor device manufactured by the manufacturing method of the present invention, the mounting method comprising the steps of: irradiating a white or visible light having a wavelength equal to or less than 800 nm onto the circuit-pattern forming surface of the substrate; receiving the visible light that has transmitted through the silicon substrate by a visible-light camera from a side of a back surface of the silicon substrate; and recognizing an image of a recognition mark formed on the circuit-pattern forming surface of the semiconductor device so as to recognize a position of the semiconductor device; and vacuum-holding the semiconductor device from the side of the back surface in accordance with a result of the position recognition, and moving and mounting the semiconductor device onto a mounting substrate in a state where the circuit-pattern forming surface faces the mounting substrate.

According to the above-mentioned invention, since the process from the individualization of the semiconductor chips by dicing to the mounting of each semiconductor chip can be performed without tape switching and turning the semiconductor chip, the mounting process is simplified and the equipments used for the semiconductor chip mounting can also be simplified.

Additionally, in the mounting method according to the present invention, the recognition mark may be a part where a protective film for protecting the circuit pattern of the silicon substrate is partially removed. Accordingly, the recognition mark can be formed by using the protective film, and there is no need to form a separate recognition mark.

Other objects, features and advantages of the present invention will become more apparent from the detailed description when read in conjunction with the accompanying drawings.

DETAILED DESCRIPTION OF THE PREFERRED EMBODIMENTS

A description will now be given, with reference to the drawings, of an embodiment according to the present invention.

A mark recognition method according to the present invention is for recognizing an image of a recognition mark using a visible light after transmitting through a silicon wafer, which has an optical transmission characteristic.

Figure 1:
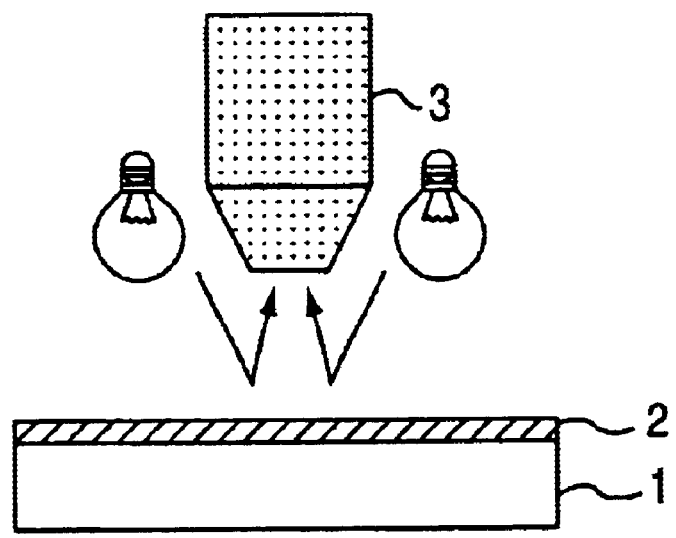
FIG. 1 is an illustration for explaining a conventional mark recognition method.
Figure 2:
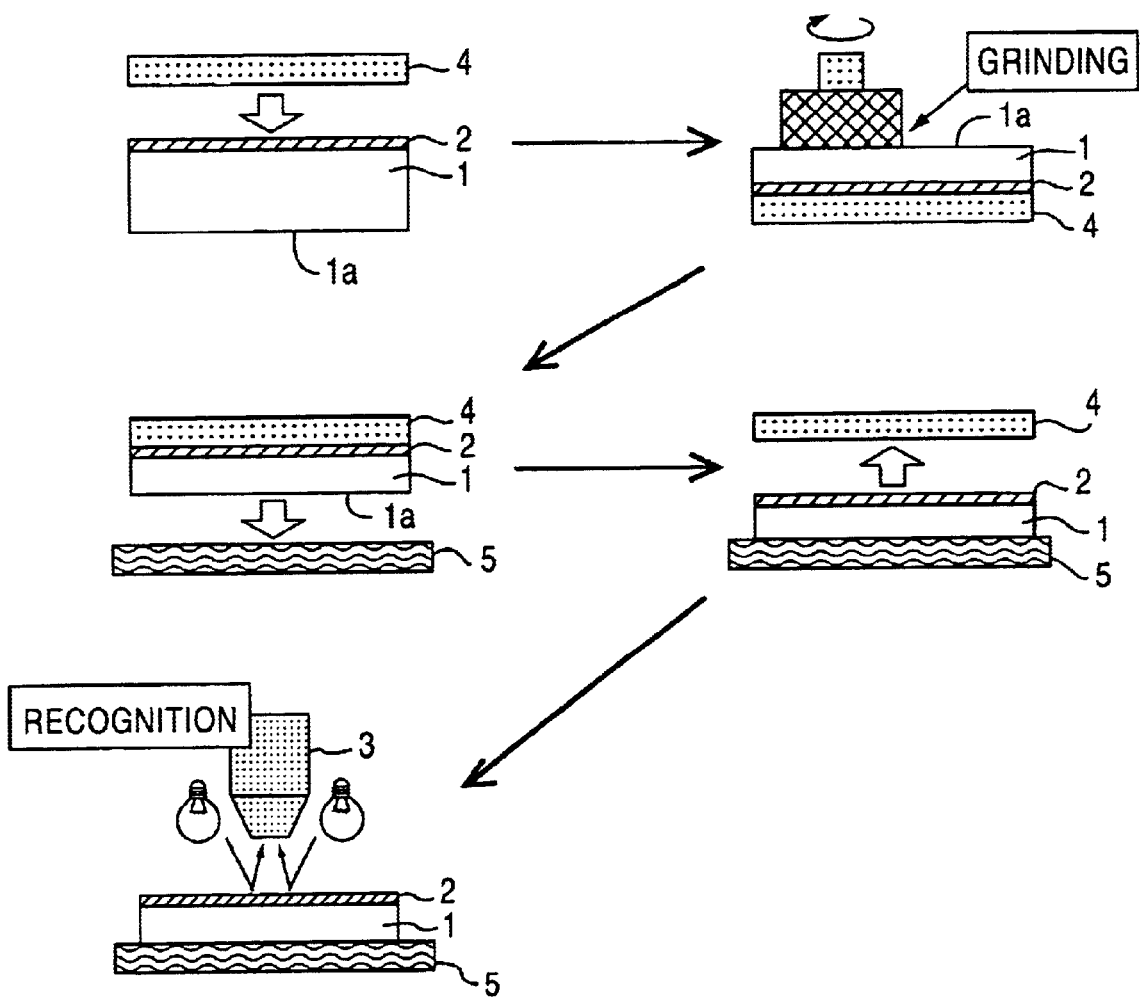
FIG. 2 is an illustration for explaining a manufacturing process of a conventional semiconductor device.
Figure 3:
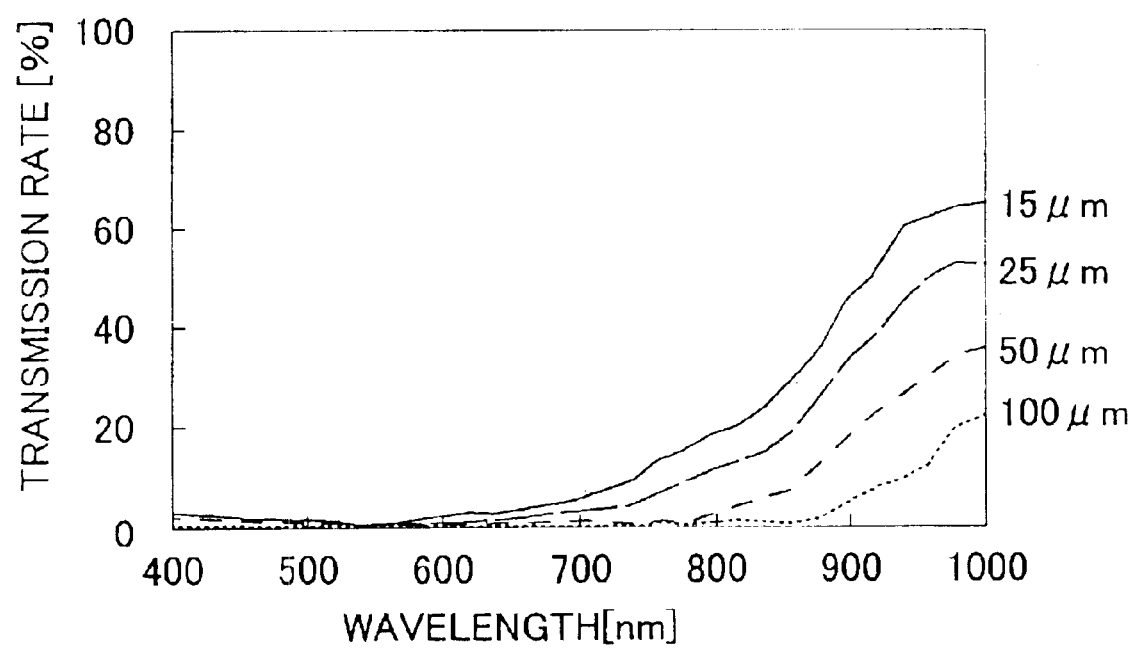
FIG. 3 is a graph showing an optical transmission characteristic of a silicon wafer.

FIG. 3 is a graph which shows an optical transmission characteristic of a silicon wafer obtained by experiments. A wafer having a thickness of 100-micrometer transmits only an infrared light having a wavelength of 850 nm or more, and does not transmit a light having a wavelength less than 850 nm including a visible light. Therefore, the transmission threshold wavelength of the wafer of 100 micrometer thickness is 850 nm. Generally, a light having a wavelength of 800 nm is a red light, and a light having a wavelength more than 800 nm is referred to as an infrared light.

It can be appreciated that the wafer of 100-micrometer thickness transmits an infrared light, but cannot transmit a visible light. However, if a wafer is ground and is made thin, the penetration threshold wavelength is reduced, and, thus, such a wafer having a reduced thickness of 50 micron transmits a light having a wavelength in a range around 800 nm as shown in FIG. 3. If the thickness is further reduced to 15 $\mu$m, it becomes possible to also transmit a light having a wavelength of about 600 nm. Therefore, it is possible to perform an image recognition with respect to a very thin wafer from a back side of the wafer by using a transmitted visible light.

Figure 4:
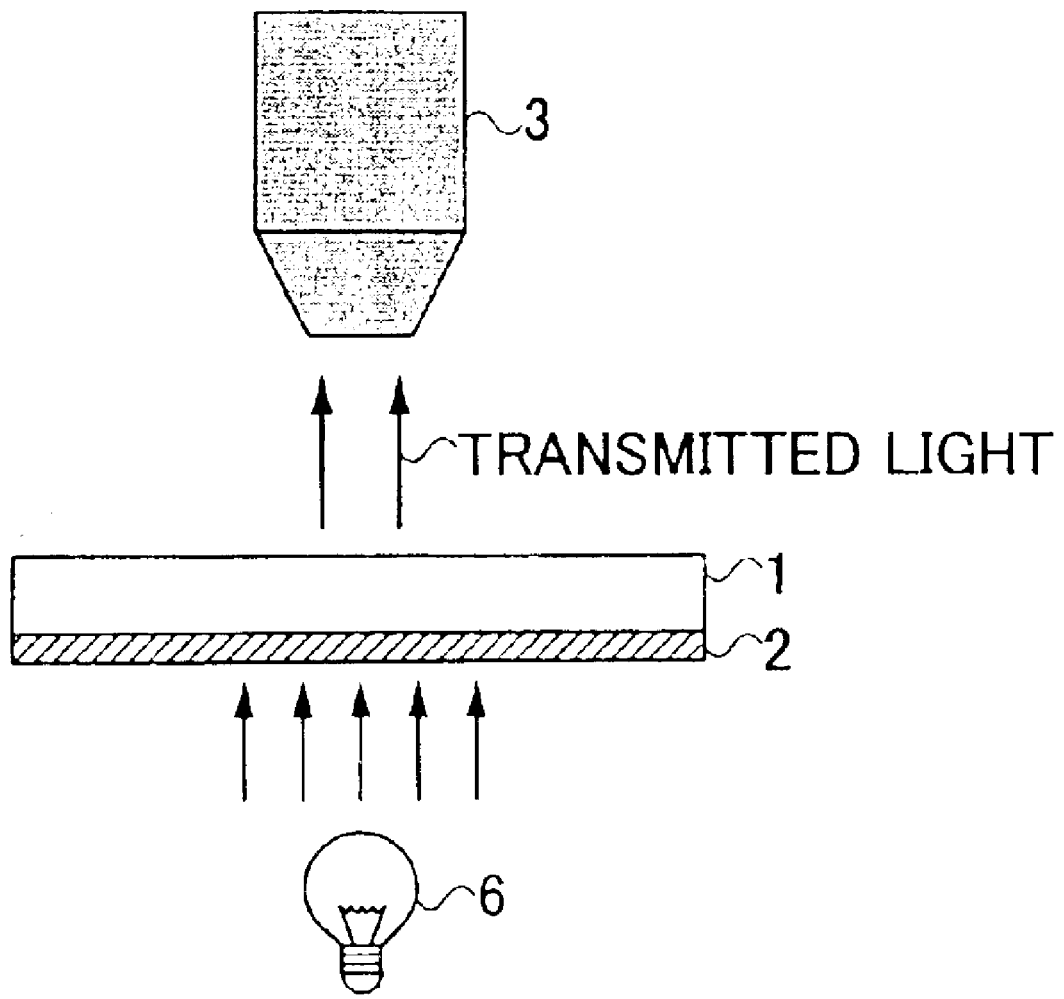
FIG. 4 is an illustration of a principle of the present invention.

FIG. 4 is an illustration for explaining a principle of the present invention that can be based on the above-mentioned knowledge. A light containing a white light or a visible light (wavelength of 800 nm or less), which can transmit a wafer, is irradiated onto a recognition mark from an illuminant 6 situated on a side of a wafer 1 where a circuit pattern 2 is formed. As the illuminant 6, a fluorescent light, an electric bulb, a light emitting diode (LED), a laser, etc. can be used. A part of the light emitted from the illuminant 6 is absorbed by the wafer 1, bur the light transmitted through the waver 1 is received by a visible-light camera 3 arranged on a side of a back surface of the wafer 1.

Depending on a material constituting the recognition mark and a periphery thereof and their configurations, the optical absorption rate with respect to a specific wavelength varies respectively. Since the intensity of a transmitted light changes due to such a difference, an image corresponding to the recognition mark is formed by the visible-light camera 3. In the present invention, a wavelength which can transmit the wafer 1 is set to 800 nm, and, thus, an image of the recognition mark can be obtained with high contrast by forming the recognition mark and the peripheral part so as to achieve clear transmission and absorption with respect to such a wavelength.

Figure 5:
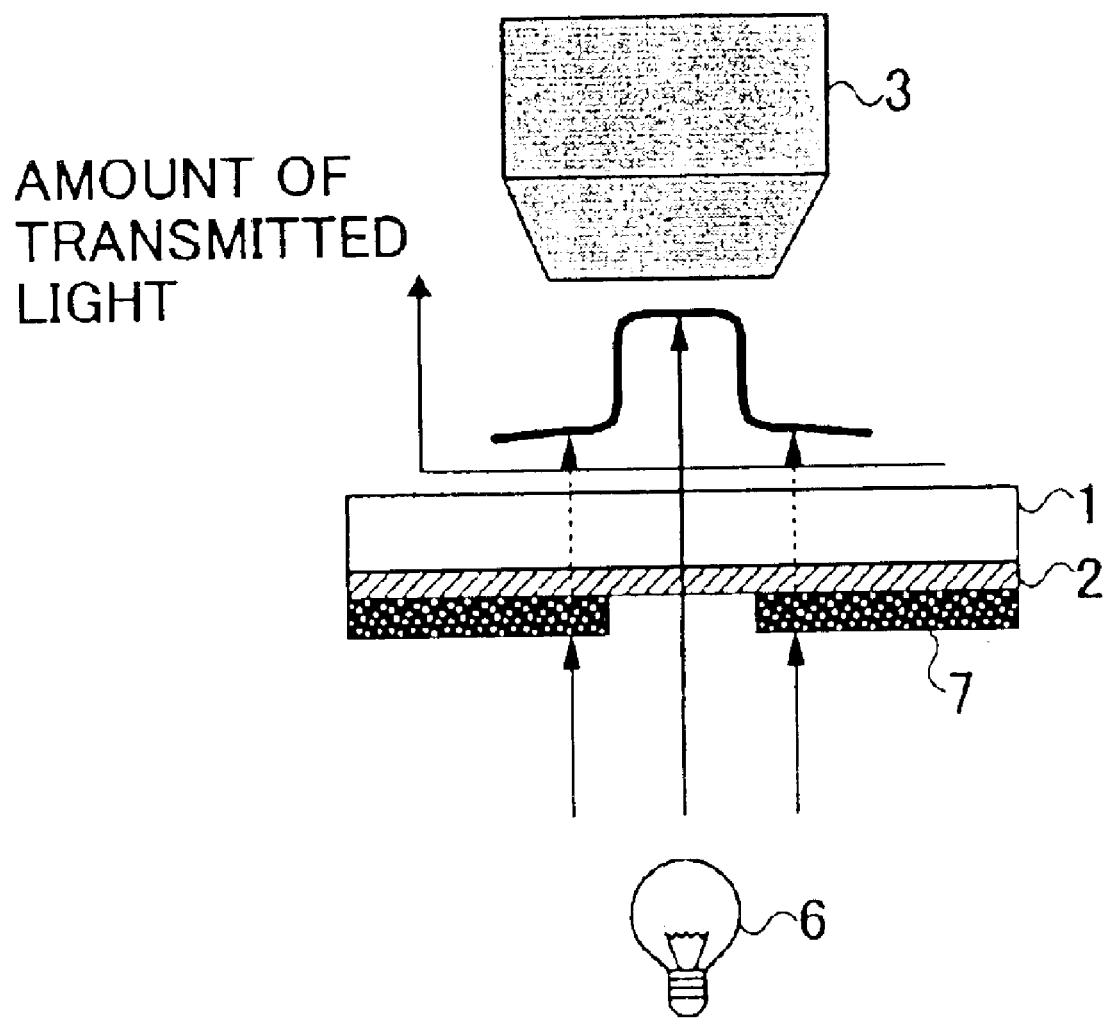
FIG. 5 is an illustration a recognition mark formed by a polyimide coat.

There is a method using a polyimide coat as an example of the method of forming a recognition mark. FIG. 5 is an illustration showing an example in which a recognition mark is formed by using a polyimide coat. In FIG. 5, although the circuit pattern 2 is covered and protected by the polyimide coat 7, a part of the polyimide coat 7 is removed and the removed part serves as a recognition mark. That is, generally, the polyimide coat 7 is in dark reddish-brown, and has the optical characteristic which absorbs a red light. Thus, a difference in the visible-light absorption rate is given between the removed part and the peripheral part thereof by removing a part of the polyimide coats 7.

Figure 6:
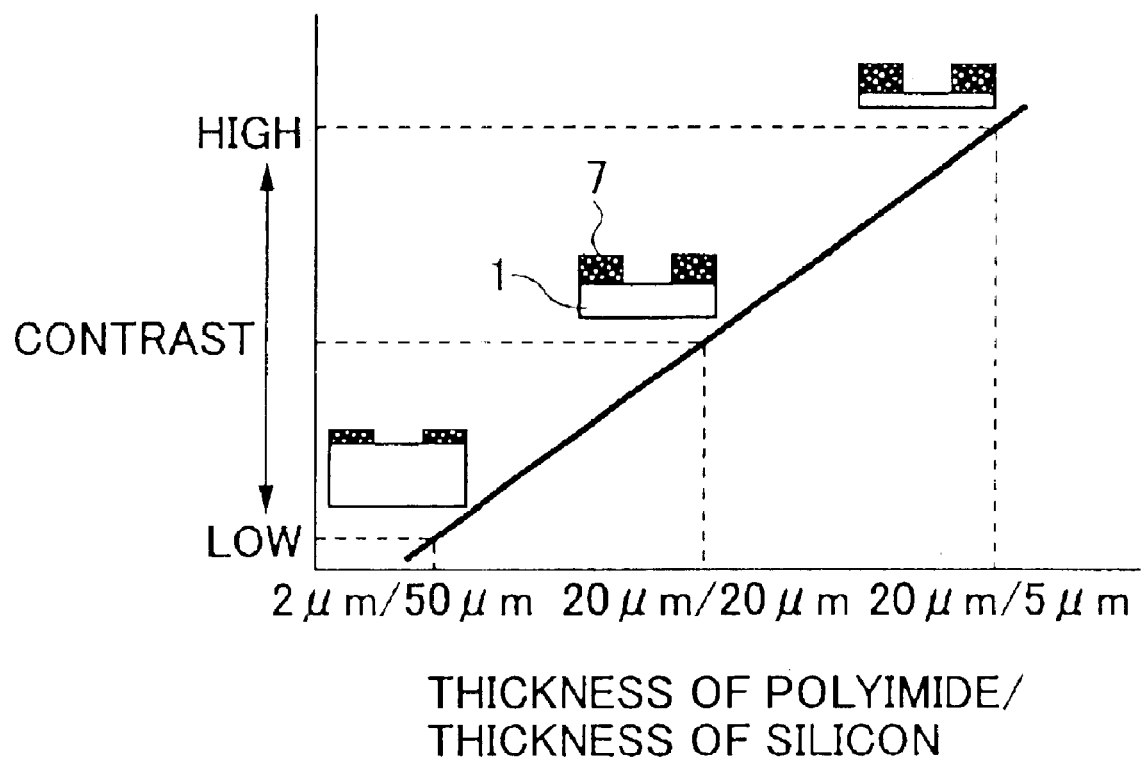
FIG. 6 is a graph showing changes in contrast in an image of a part where the polyimide coat is removed when a thickness of the polyimide coat and a thickness of a silicon wafer are varied.

An image with arbitrary contrast can be obtained by setting the thickness of the polyimide coat 7 to a thickness in consideration of the thickness of the silicon wafer 1, which is within a range of 2–20 $\mu$m. FIG. 6 is a graph which shows change in the contrast in the image of the removed part of the polyimide coat 7 when the thickness of the polyimide coat 7 and the thickness of the silicon wafer 1 are varied.

When the thickness of the silicon wafer 1 is set to 50 $\mu$m and the thickness of the polyimide coat 7 is set to 2 $\mu$m, the contrast of the recognition mark is low. Here, the contrast becomes high, when thickness of the silicon wafer 1 is set to 20 $\mu$m and the thickness of the polyimide coat 7 is set to 20 $\mu$m. Furthermore, the contrast becomes very high when the thickness of the silicon wafer 1 is set to 5 $\mu$m and the thickness of the polyimide coat 7 is set to 20 $\mu$m.

As mentioned above, the contrast in the image of the recognition mark (removed part of the polyimide coat 7) becomes higher as the thickness of the silicon wafer 1 is thinner and the thickness of the polyimide coat 7 is thicker. That is, although the visible light (red light) which transmitted through the silicon wafer 1 is incident on the visible-light camera 3 in the part where the polyimide coat 7 is removed, in the part covered by the polyimide coat 7, a part of the visible light is absorbed by the polyimide coat 7 and the visible light is incident on the visible-light camera with a reduced intensity.

Therefore, the amount of the transmitted light absorbed by the wafer 1 increases as the thickness of the polyimide coat 7 increases, and the intensity of the light which reaches the visible-light camera 3 is reduced. That is, the image taken by the visible-light camera 3 has a higher contrast as the polyimide coat 7 is thicker. Additionally, the intensity of the transmitted light is higher and the contrast is higher as the silicon wafer 1 is thinner.

In the above-mentioned example, although the removed part of the polyimide coat 7 serves as a recognition mark and a part with a low intensity of the transmitted light corresponds to the recognition mark, the recognition mark itself may be formed by a polyimide resin. In such a case, in the recognized image by the visible-light camera 3, a part with a low intensity of the transmitted light corresponds to the recognition mark. Moreover, if the wavelength of the visible light made to transmit is selected suitably, the material of the recognition mark is not limited to a polyimide resin and a recognition mark formed by copper (Cu), aluminum (Al), etc. can also be recognized. In such a case, the recognition mark can be formed simultaneously with formation of the circuit pattern 2. Additionally, the circuit pattern 2 or a part thereof can also be used as a recognition mark.

Figure 7:
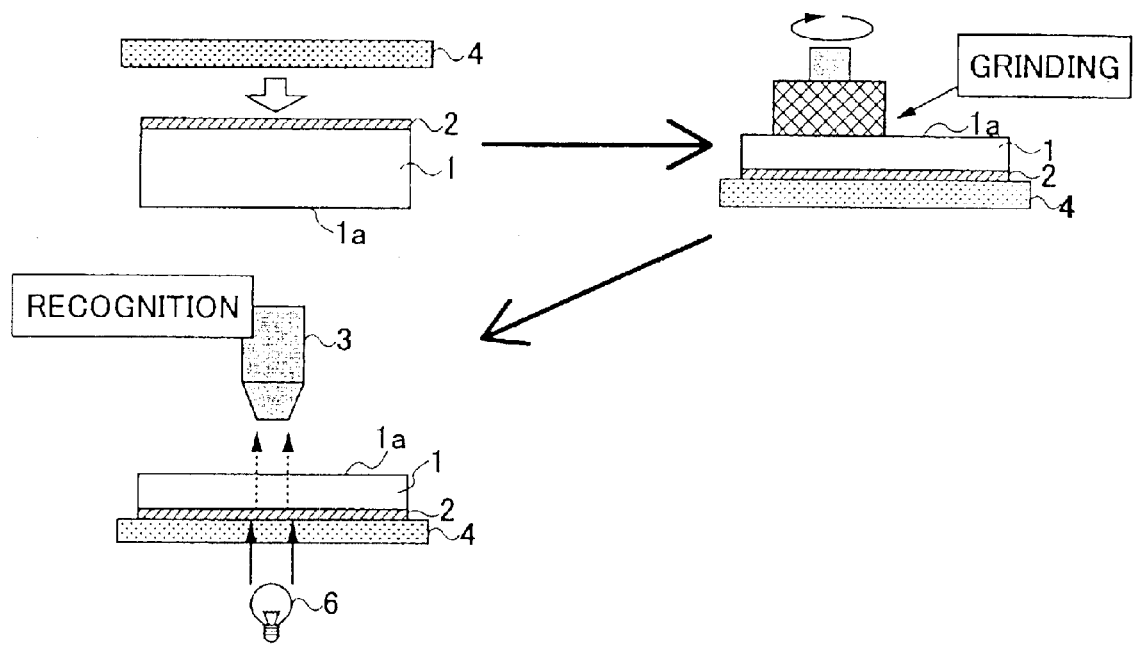
FIG. 7 is an illustration for explaining a part of a semiconductor manufacturing process using a mark recognition method according to the present invention.

A description will now be given, with reference to FIGS. 7 through 9, of a semiconductor device manufacturing process using the above-mentioned mark recognition method. FIG. 7 is an illustration for explaining a part of the semiconductor device manufacturing process using the above-mentioned mark recognition method.

In the manufacturing process shown in FIG. 7, a masking tape 4 is first applied onto a surface (a surface on which the recognition mark is formed on the polyimide coat etc.) of the circuit pattern 2 of the wafer 1, and, then, a back surface 1a of the wafer 1 is ground so as to reduce the thickness of the wafer 1. Although the thickness of the wafer 1 prior to the grinding is 700 $\mu$m, the thickness of the wafer 1 after grinding is preferably 5–50 $\mu$m. If the thickness of the wafer 1 is smaller than 5 $\mu$m, there may be an influence to the circuit formed on the wafer 1, and the strength of the wafer 1 is reduced, which increases a possibility of wafer cracking. On the other hand, it the thickness of the wafer 1 exceeds 50 $\mu$m, the amount of the transmitted visible-light decreases extremely, and it becomes impossible to perform an image recognition.

After the back-surface grinding of the wafer 1 is completed, a visible light is irradiated by an illuminant 6 from the side of the protective tape 4, and the transmitted light is received by the visible-light camera 3 on the side of the back surface of the wafer 1. The masking tape 4 is a transparent adhesive tape, and transmits a visible light. The visible-light camera 3 performs image recognition based on the transmitted light received, and recognize the location of the recognition mark.

Figure 8:
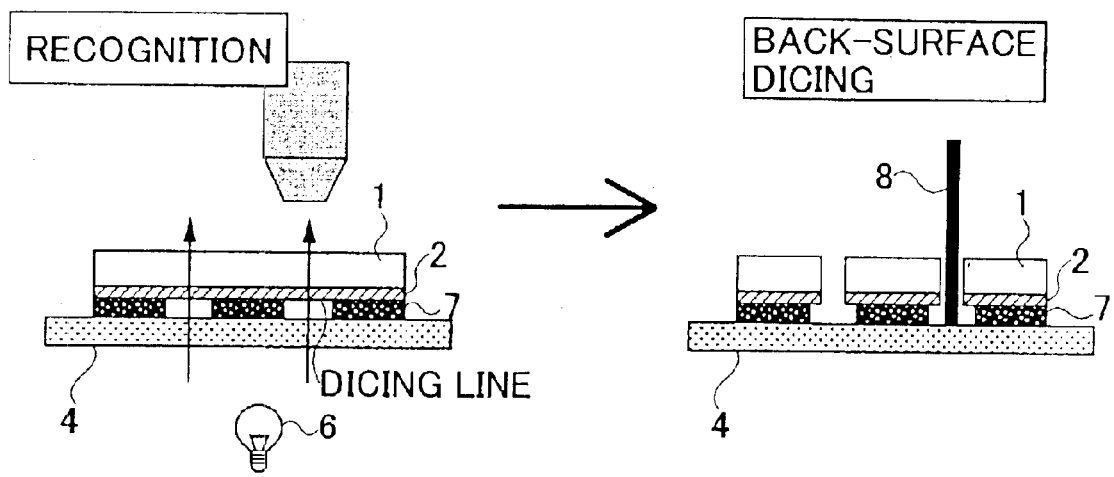
FIG. 8 is an illustration for explaining a process of individualizing semiconductor devices by dicing the wafer based on a position of the recognition mark recognized by the process shown in FIG. 7.

FIG. 8 is an illustration for explaining a process of individualizing semiconductor devices by dicing the wafer 1 based on the position of the recognition mark recognized in the process shown in FIG. 7.

In FIG. 8, the recognition mark is formed as a part where the polyimide coat 7 is removed long the dicing lines. That is, in the dicing process shown in FIG. 8, by removing the polyimide coat 7 formed on the circuit pattern along the dicing lines, the image recognition of the dicing lines is performed using the transmitted light after the back-surface grinding of the wafer 1 and the wafer 1 is diced using a blade 8 from the back surface of the wafer 1. Therefore, after the back-surface grinding of the wafer 1, the dicing along the recognized dicing lines can be performed while the wafer 1 is maintained to be stuck on the protective tape 4.

In a conventional process, in order to perform recognition from the side of the circuit pattern surface after the back-surface grinding of the wafer, switching of the tape is performed. However, in the present invention, since the image recognition of dicing lines can be performed as it is after the back-surface grinding, the tape switching process is not needed. That is, the masking tape 4 is used as a dicing tape as it is. Thereby, a large reduction in the production tact and a reduction in the cost can be achieved. Moreover, there is no possibility of occurrence of problems such as wafer cracking or pattern braking in the tape switching process.

As mentioned above, although the polyimide coat 7 is formed on the formation surface of the circuit pattern 2 of the wafer 1, generally, coating is not provided on the dicing lines. Therefore, with the conventional polyimide coat, the image of the dicing lines can be clearly recognized from the side of the back surface of the wafer. Based on the recognition result, the dicing (cutting) of the wafer 1 can be carried out by dicing the wafer 1 with the same accuracy as the image recognition from the side of the circuit pattern surface. Moreover, since the circuit pattern surface is not exposed by dicing from the back surface of the wafer 1, wire breaking in the circuit pattern 2 due to adhesion of cutting chips can be prevented.

The mark recognition method according to the present invention is applicable not only to the above-mentioned dicing process but also to mechanical processing of a wafer after thinning (hole, groove, thin film removal, etc.), parts mounting (wafer reinforcement frame, capacitor, etc.), wafer mounting onto an apparatus stage and laminating of a wafer on another wafer. Moreover, it is also possible to recognize a manufacturing lot number and a wafer identification number of an individual wafer can be recognized by using the above-mentioned mark recognition method.

Moreover, the mark recognition method according to the present invention can be used in a case where an individualized semiconductor chip is die-bonded to a substrate and a case where semiconductor chips are stacked with high accuracy. Furthermore, the mark recognition method according to the present invention is particularly very effective in flip-chip mounting.

The back surface of the semiconductor chip, which has been individualized through the conventional dicing process, is stuck on the dicing tape, and the circuit-pattern surface thereof is exposed. For this reason, in a case where the semiconductor chip is picked up and is mounted onto a substrate, the semiconductor chip is first picked up by holding the circuit-pattern surface by a vacuum collet, and, then, the back surface of the semiconductor chip is held by another vacuum collet. Furthermore, the collet is rotated so as to face the circuit pattern formation surface of a semiconductor chip downward (face down), and the chip is mounted onto the substrate.

On the other hand, in a case where the mark recognition method according to the present invention is used, the back surface of the wafer is exposed and is faced upward at the time of performing the back-surface grinding, and, thus, the semiconductor chips formed on the wafer are individualized through the dicing process without changes. FIG. 9 is an illustration for explaining a flip-chip mounting process using the mark recognition method according to the present invention.

Figure 9:
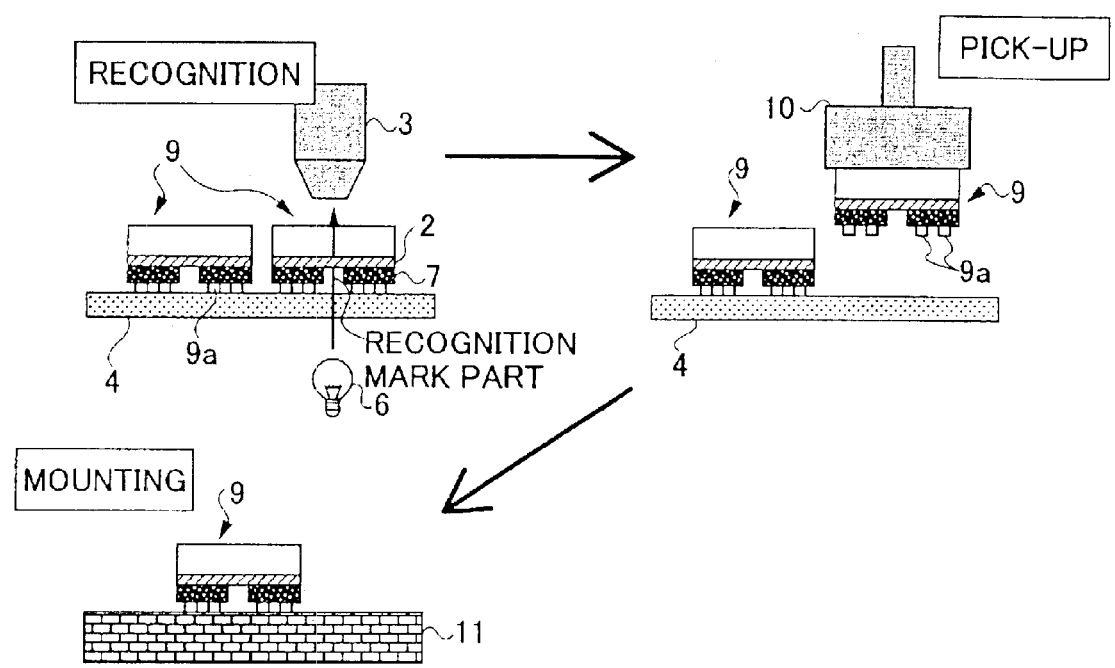
FIG. 9 is an illustration for explaining a flip-chip mounting method using the mark recognition method according to the present invention.

In the flip-chip mounting process shown in FIG. 9, the image recognition of the recognition mark is performed from the side of the back surface of the wafer by the mark recognition method according to the present invention. In the case of the example shown in FIG. 9, a part where the polyimide coat 7 is removed is used as the recognition mark. For example, a square recognition mark can be formed by removing the polyimide coat 7 in a square shape in a center portion of the semiconductor chip 9. However, since bumps 9a formed on the circuit pattern can also be recognized from the side of the back surface, it is not always necessary to form a separate recognition mark, and the position of the semiconductor chip 9 may be recognized based on the result of image recognition of the bumps 9a.

Then, based on the image recognition, the back surface of the semiconductor chip 9 is attracted by the collet 10, and is separated from the masking tape 4, which serves as a dicing tape. Here, the bump 9a are previously formed on the semiconductor chip 9 as external connection terminals. It should be noted that although it is indicated, in FIG. 9, that the bumps 9a are formed on the polyimide coat 7, actually the bump 9a are formed on the circuit pattern 2.

Since the semiconductor chip 9, which is picked up by the collet 10, is already in a face down state, the semiconductor chip 9 can be flip-chip mounted onto a mounting substrate 11 without changes. Therefore, in the flip-chip mounting using the mark recognition method according to the present invention, a troublesome switching and turning of a semiconductor chip can be omitted, which simplifies the equipment related to the mounting process.

The present invention is not limited to the specifically disclosed embodiments, and variations and modifications may be made without departing from the scope of the present invention.

The present application is based on Japanese priority application No. 2002-153518 filed May 28, 2002, the entire contents of which are hereby incorporated by reference.

What is claimed is:

1. A mark recognition method of image recognition of a recognition mark formed on a circuit-pattern forming surface of a silicon substrate, comprising:

setting a thickness of the silicon substrate to 5 $\mu$m to 50 $\mu$m;

irradiating a white or visible light having a wavelength equal to or less than 800 nm onto the circuit-pattern forming surface of the substrate;

receiving the visible light that has transmitted through said silicon substrate by a visible-light camera on a side of a back surface of said silicon substrate; and recognizing the image of the recognition mark formed on the circuit-pattern forming surface of said silicon substrate.

2. The mark recognition method as claimed in claim 1, wherein said recognition mark is a part where a protective film for protecting the circuit pattern of said silicon substrate is partially removed.

3. The mark recognition method as claimed in claim 2, wherein said visible light is a red light and said protective film is made of polyimide resin.

4. The mark recognition method as claimed in claim 2, wherein a contrast of the recognition mark in the recognized image is increased by increasing a ratio of a thickness of said protective film to a thickness of said silicon substrate.

5. A mounting method of a semiconductor device manufactured by the manufacturing method of claim 1, the mounting method comprising the steps of:

irradiating a white or visible light having a wavelength equal to or less than 800 nm onto the circuit-pattern forming surface of the substrate;

receiving the visible light that has transmitted through said silicon substrate by a visible-light camera from a side of a back surface of said silicon substrate; and recognizing an image of a recognition mark formed on the circuit-pattern forming surface of the semiconductor device so as to recognize a position of the semiconductor device; and vacuum-holding the semiconductor device from the side of the back surface in accordance with a result of the position recognition, and moving and mounting the semiconductor device onto a mounting substrate in a state where the circuit-pattern forming surface faces said mounting substrate.

6. The mounting method as claimed in claim 5, wherein said recognition mark is a part where a protective film for protecting the circuit pattern of said silicon substrate is partially removed.

7. A manufacturing method of a semiconductor device using a silicon substrate on which a plurality of semiconductor devices are formed simultaneously, comprising the steps of:

grinding a back surface of the silicon substrate so as to reduce a thickness to 5 $\mu$m to 50 $\mu$m;

irradiating a white or visible light having a wavelength equal to or less than 800 nm onto a circuit-pattern forming surface of said silicon substrate;

receiving the visible light after transmitting through said silicon substrate on a side of the back surface of said silicon substrate;

recognizing an image of a recognition mark formed along dicing lines formed on the circuit-pattern forming surface of said silicon substrate; and individualizing the semiconductor devices by dicing from the side of the back surface of said silicon substrate based on a result of the image recognition.

8. The manufacturing method as claimed in claim 7, further comprising the steps of:

forming a protective film protecting the circuit pattern formed on said silicon substrate; and removing a part of the protective film along the dicing lines so that the removed part is used as the recognition mark.

9. The manufacturing method as claimed in claim 7, further comprising the steps of:

applying a protective film onto the circuit pattern forming surface of said silicon substrate before grinding said silicon substrate;

irradiating a visible light onto the circuit-pattern forming surface through the protective tape while the protective film is attached to said silicon substrate after grinding said silicon substrate;

recognizing an image of the recognition mark along the dicing lines from the side of the back surface of said silicon substrate; and dicing said silicon substrate by using said protective film applied on said silicon substrate as a dicing tape.

10. The manufacturing method as claimed in claim 7, further comprising the step of recognizing a lot number and an identification number provided on said silicon substrate by using the visible light after transmitting through said silicon substrate on the side of the back surface of said silicon substrate.

* * * * *